United States Patent [19]

Kawana

[11] Patent Number: 5,282,164
[45] Date of Patent: Jan. 25, 1994

[54] PROGRAMMABLE INTEGRATED CIRCUIT

[75] Inventor: Keiichi Kawana, Chiba, Japan

[73] Assignee: Kawasaki Steel Corporation, Hyogo, Japan

[21] Appl. No.: 796,686

[22] Filed: Nov. 25, 1991

[30] Foreign Application Priority Data

Nov. 27, 1990 [JP] Japan .................. 2-323783

[51] Int. Cl.[5] .............. G11C 7/00; G11C 19/00; G06F 7/38
[52] U.S. Cl. .................. 365/189.12; 365/219; 365/230.05; 307/465
[58] Field of Search .......... 365/189.05, 189.12, 365/219, 230.05; 307/465

[56] References Cited

U.S. PATENT DOCUMENTS

| | | | |
|---|---|---|---|
| 4,616,343 | 10/1986 | Ogawa | 365/219 |
| 4,644,502 | 2/1987 | Kawashima | 365/219 |
| 4,663,735 | 5/1987 | Novak et al. | 365/189.05 |
| 4,718,039 | 1/1988 | Aichelmann, Jr. et al. | 365/219 |
| 4,723,226 | 2/1988 | McDonough et al. | 365/189.05 |
| 4,758,745 | 7/1988 | Elgamal et al. | 307/465 |
| 4,858,190 | 8/1989 | Yamaguchi et al. | 365/189.05 |
| 4,870,302 | 9/1989 | Freeman | 307/465 |
| 4,890,261 | 12/1989 | Hidaka et al. | 365/189.12 |
| 5,014,244 | 5/1991 | Lammerts et al. | 365/219 |

*Primary Examiner*—Eugene R. LaRoche
*Assistant Examiner*—Michael C. Kessell
*Attorney, Agent, or Firm*—Oliff & Berridge

[57] ABSTRACT

A programmable integrated circuit of the present invention can change the input system of serial/parallel input-parallel output circuit for program data from serial to parallel or vice versa in response to a control signal from control signal input. Therefore, a program can be written at a relatively low speed through the parallel output of serial input, and a program can be written at a relatively high speed by inputting data in parallel and outputting the input data in parallel. Moreover, the bit width of the aforementioned serial/parallel input-parallel output circuit can be changed in response to a control signal from control signal input, whereby bit width for data input, shift and the like can be optimized according to the quantity of programs to be written with the result of improved freedom of users and the reduced time required for writing a large quantity of programs.

7 Claims, 8 Drawing Sheets

PROGRAMMABLE INTEGRATED CIRCUIT

BACKGROUND OF THE INVENTION

The present invention relates to a programmable integrated circuit having programmable wiring which is programmed freely by a user to achieve his/her desired function element.

There has heretofore been known a programmable integrated circuit having an internal structure capable of programming logic as a kind of data such as a PLD (programmable logic device) using a variety of RAMs, SRAMs, PROMs, EPROMs or EEPROMs.

In such a programmable integrated circuit, programming for writing desired logic is performed by a user to form a desired function element within the integrated circuit. The programming is available in fuse type, electrical erase type and ultraviolet erase type.

Figure 4:
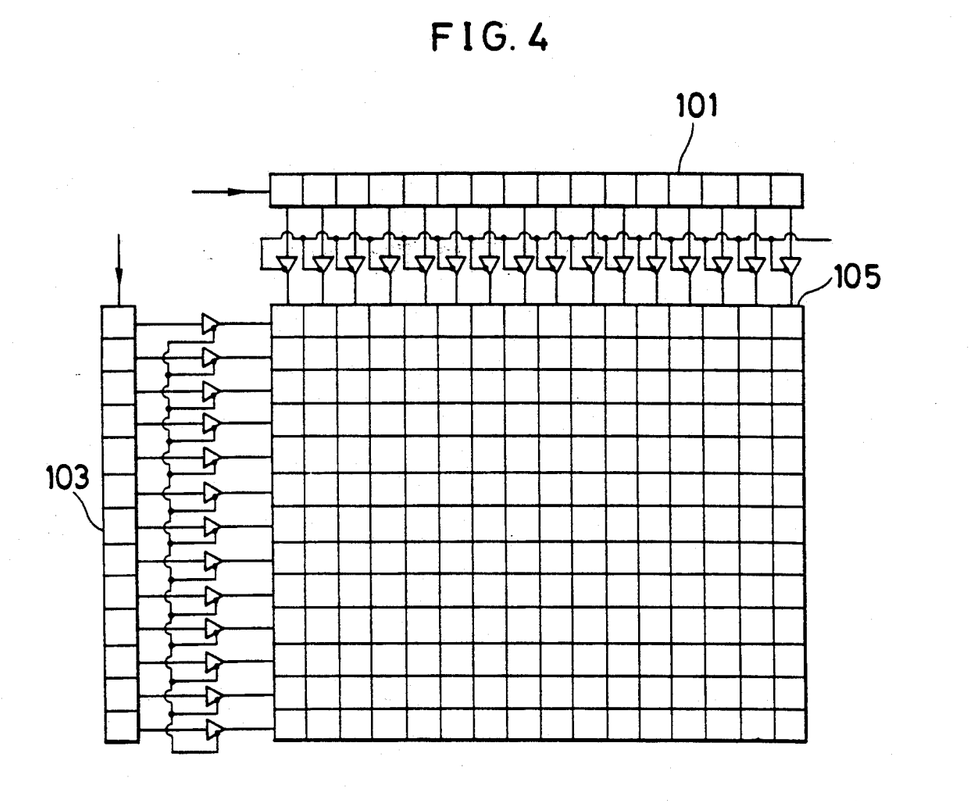
FIG. 4 is a typical diagram of a prior art programmable integrated circuit.

FIG. 4 is a schematic diagram illustrating the circuit of an electrically writable programmable integrated circuit for example. In FIG. 4, the integrated circuit includes a programmable logic device 105 (hereinafter referred to as "PLD") such as a SRAM (static random access memory) and furthermore an X-decoder (bit line driver) 101 and Y-decoder (word line driver 103), both for writing programming data. Shift registers for inputting and outputting serial data are used as these decoders. The shift registers for inputting and outputting serial data can be constituted by circuits shown in FIG. 5a. For example, serial data to be inputted into the bit line driver is inputted every bit and shifted in response to the input of a clock signal CLK. To allow the bit line driver 101 to receive serial data equivalent to the number of bit lines, the serial data is inputted into the shift register one by one in response to the clock signals. When the clock signals equivalent to the number of bit lines have been inputted, data input is suspended.

Meanwhile, the word line driver 103 is shifted to a predetermined register in response to the clock signals. In this case, when an enable signal is inputted into both of the bit and word line drivers, data on a bit line in the shift register of the bit line driver 101 is written on the programmable logic element (hereinafter referred to as "PLE") of the PLD 105 at the position of a word line in the shift register of the word line driver 103. For example, as shown in FIG. 5c, data is located in the register at a position n of the bit line driver 101 and in the register at a position m of the word line driver 103, desired logic is inputted into the PLE at an intersection of the both lines of the PLD 105 at the time when a bit line enable signal B-EN agrees with a word line enable signal W-EN.

Likewise, only a predetermined number of new data is read from the shift register of the bit line driver 101 and the shift register of the word line driver 103 is shifted to the word line at a predetermined write position in accordance with reading the new data. Then data located on the bit line is written on the programmable logic device 105 on the word line at a predetermined write position. In this way, programming data is written on the PLD 105.

When the shift register is used as a decoder a described in the foregoing, chip area can be saved and wiring width can be reduced, compared with other input/output means. A programmable integrated circuit having such a structure is described in U.S. Pat. No. 4,870,302 for example.

In the conventional circuit as described in the foregoing, writing (transferring) programming data with the shift register is performed every one-bit. Therefore, even if programming data is received in parallel from the data recorder, programming data is written in series and accordingly, write time is determined by the transfer time of programming data. This transfer speed is particularly important when a test program is executed before programming for setting functions. Test programming is to be performed before programming for setting logic to enable users to construct any circuit through programming. This is an especially important feature of an PLD which programs electrically. This test programming is effected by a program for executing several hundreds of tests such as wiring check. When this test program is executed, processing test programming takes time longer than desired if the speed of data transfer by the aforementioned shift register is low.

BRIEF SUMMARY OF THE INVENTION

It is an object of the invention to eliminate the aforementioned problem of the prior art and to provide a programmable integrated circuit which can reduce the time of data transfer by a shift register and furthermore can change data transfer time depending on test patterns.

To attain the above object, the present invention provides a programmable integrated circuit comprising a programmable logic device consisting of programmable logic elements capable of writing programming data disposed in an array, write means for writing said programming data on said programmable logic device, having means for inputting one-bit serial data, means for inputting at least one multiple-bit parallel data, and means for selecting said serial data input or at least one of said parallel data inputs, and input means for inputting a control signal into selection means for selecting said serial data input or at least one of said parallel data inputs, said selection means selects said serial data input or at least one of said parallel data inputs with said control signal.

Preferably, said selection means changes the bit width of the input data in response to the control signal from said control signal input means.

Preferably, the bit width of the input data is shifted between one bit and at least one of 4 bits, 8 bits and 16 bits.

Preferably, said programming data write means is a shift register for outputting temporarily written data in parallel to the bit line of said programmable logic device.

Preferably, said programming data write means includes another shift register for outputting the serial input of one-bit data in parallel to a word line.

In one preferred embodiment, said selection means is a bi-state selector for selecting either one of said serial data input or a parallel data input.

In another preferred embodiment, said selection means is a tri-state selector for selecting either one of said serial data input and two parallel data inputs.

According to the present invention, there is provided a programmable integrated circuit including programming data write means to write programming data, characterized in that said programming data write means comprises means for outputting one-bit serial input in parallel and means for outputting serial input or parallel input in parallel and capable of changing the bit width of data; the programmable integrated circuit further comprises means for inputting a control signal to means for outputting serial input or parallel input in parallel and capable of changing the bit width of data; and serial input or parallel input is selected for said means for outputting serial input or parallel input in parallel in response to the input of the control signal from said control signal input means.

Preferably, the bit width of said means for outputting serial input or parallel input in parallel is changed for data input in response to the input of said control signal from said control signal input means.

According to the present invention, there is provided a programmable integrated circuit including programming data write means to write programming data characterized in that said programing data write means comprises a shift register for outputting one-bit data between serial in parallel to a word line and a shift register for parallel output to a bit line having a selector for selecting serial input or parallel input to change the bit width of data; the programmable integrated circuit further comprises control signal input means for inputting a control signal into said selector, connected to the control input terminal of the selector of said shift register for parallel output to the bit line; and that said selector of said shift register for parallel output to the bit line selects serial input or parallel input to change the bit width of data in response to the control signal from said control signal input means.

BRIEF DESCRIPTION OF THE DRAWINGS

FIG. 5b is a timing chart for writing a program in the circuit configuration of FIG. 5a.

DETAILED DESCRIPTION OF THE INVENTION

A programmable integrated circuit according to the present invention can change the input system of parallel output means for parallel outputting serial input or parallel input of program data (abbreviated as "serial/parallel input-parallel output means") from serial to parallel and vice versa with selection means in response to a control signal from means for inputting a control signal (abbreviated as "control signal input means"). Therefore, a program can be written at a relatively low speed through the parallel output of serial input, and a program can be written at a relatively high speed by inputting data in parallel and outputting the input data in parallel. In addition, the bit width of the aforementioned serial/parallel input-parallel output means can be changed in response to a control signal from the control signal input means. Consequently, this makes it possible to optimize the bit width for data input, shift and the like according to the quantity of programs to be written with the result of improved freedom of users and the reduced time required for writing a large quantity of programs.

Figure 3:
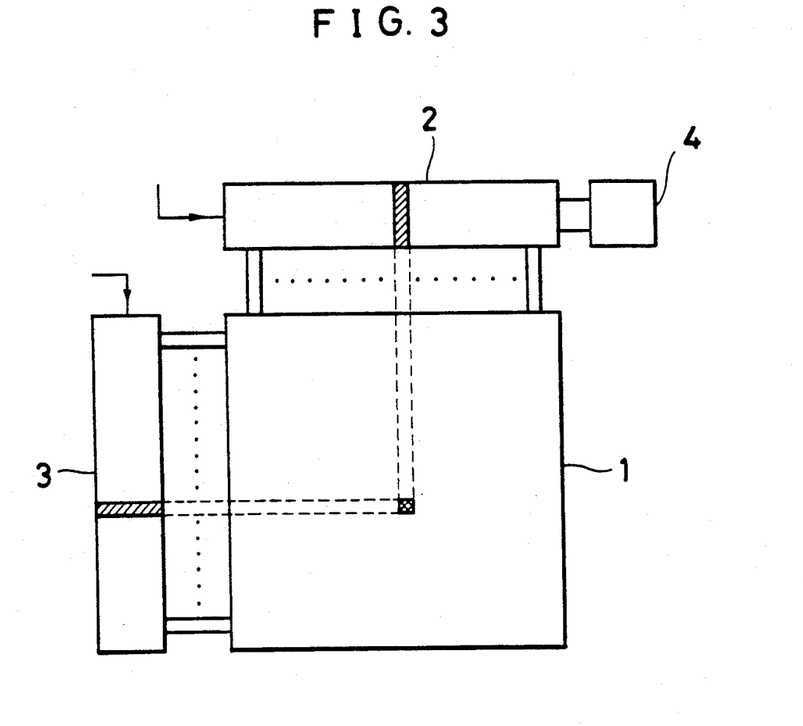
FIG. 3 is a schematic diagram illustrating the configuration of an embodiment of a programmable integrated circuit of the present invention.

The operation of a programmable integrated circuit according to the present invention will be described with reference to the typical illustration of FIG. 3. When logic data is written in matrix on logic data memory means 1, the input system of data serial/parallel input-parallel output means 2, for example serial input or parallel input, as well as an appropriate bit width can be selected with a control signal from control signal input means 4. When data which agrees with this bit width is taken in parallel into serial/parallel input-parallel output means 2, data to be written is shifted to a predetermined line position of the serial data input means 3, and a write signal (enable signal) is inputted into respective input means so that data from the aforementioned serial/parallel input-parallel output means 2 is written in parallel on logic data memory means 1 at the line position.

Since the bit width of the serial/parallel input-parallel output means can be changed through control of control signal input means, in case of test pattern programming wherein a large volume of program data is written, the time required for tests can be reduced by making the bit width appropriate and larger than when a normal program is inputted.

A preferred embodiment of the present invention will be described with reference to the drawings.

Figure 1:
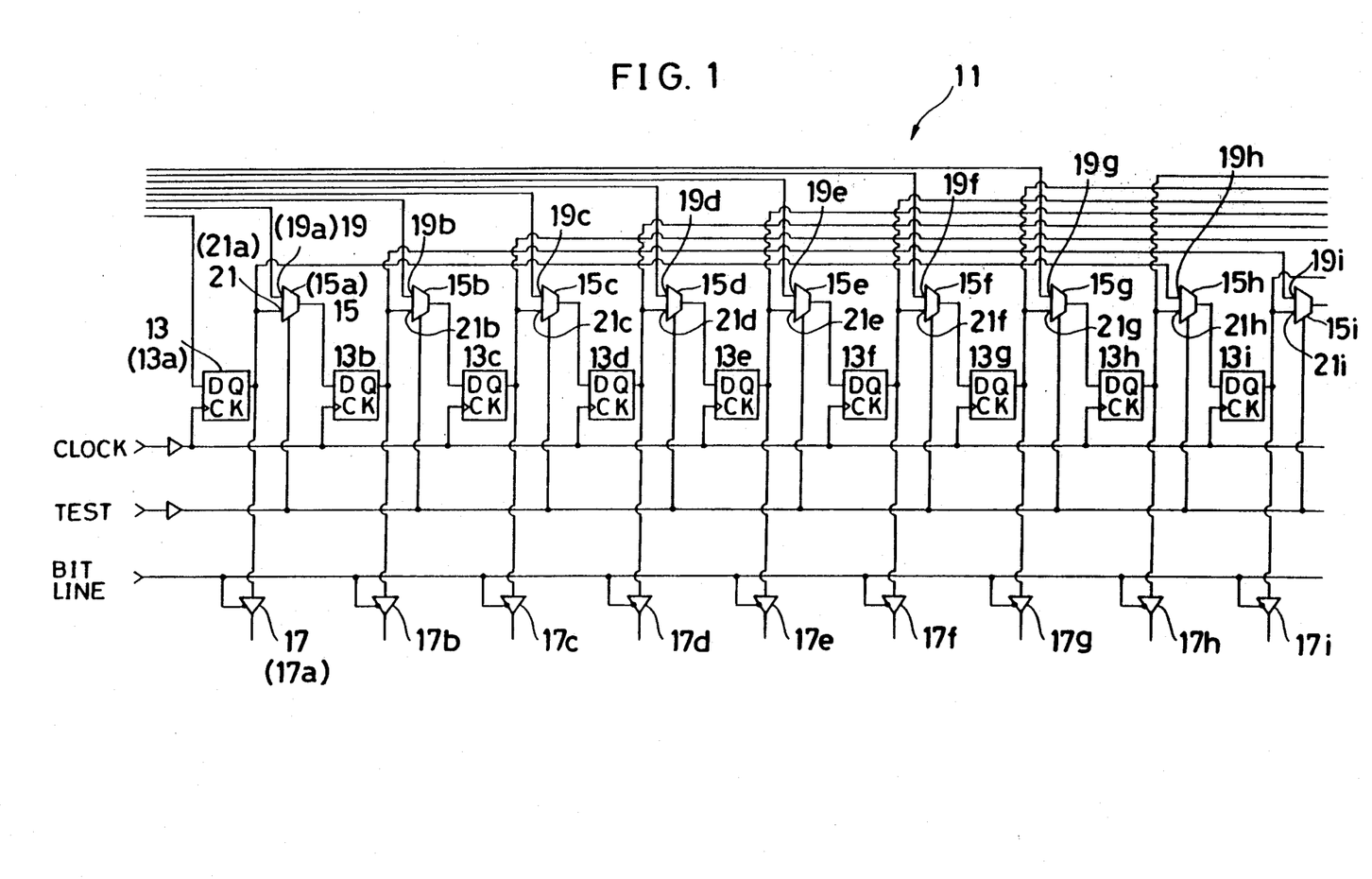
FIG. 1 is a circuit diagram of an embodiment of a shift register used as a bit line driver of a programmable integrated circuit according to the present invention.

FIG. 1 illustrates an embodiment of the circuit configuration of input means which can input in parallel a plurality of bits of a programmable integrated circuit according to the present invention.

This circuit diagram is a detail view of a shift register which is used as a bit line driver of the programmable integrated circuit according to the present invention. The shift register 11 includes a plurality of D type flip-flops 13 (13a to 13i), D input terminals of which a plurality of data are inputted into and CK input terminals of which clock signals are inputted into. The Q output terminals of the D type flip-flops 13 are connected to the second terminals 21 (21a to 21i) of the selectors 15 (15a to 15i), and also to the first terminals 19 (19a to 19i) of selectors 15 which are separated from the former selectors by a predetermined number N (eight in the figure) of selectors. Moreover, the Q output terminals of D type flip-flops 13 are connected to a plurality of programmable logic elements (PLEs) of the programmable logic device (not shown) through switches 17 (17a to 17i) connected to the bit line. The control input terminals of the aforementioned selectors 15 are each commonly connected to the test signal line TEST so that serial/parallel input and bit width are selected in response to a control signal from the test signal line. Namely, in the embodiment shown in the figure, bi-state selectors 15 select one-bit serial data input or eight-bit parallel data input. In this case, when eight-bit parallel data input is selected, data inputted every 8 bits in parallel into the shift register 11 is shifted to parallel every 8 bits in response to one clock.

In the shift register having such a structure, when a normal program is written, the test signal line becomes a low level "L", and the selector 15 (for example 15a) connected to the test signal line connects a signal to be inputted into the second terminal 21 (for example 21a) of the selector 15, namely the output signal of the Q output terminal of the D type flip-flop in the previous stage (for example 13a), to the D input terminal of the D type flip-flop (for example 13b) in the rear stage. Likewise, all the selectors select the second terminals 21a to 21i.

Figure 5A:
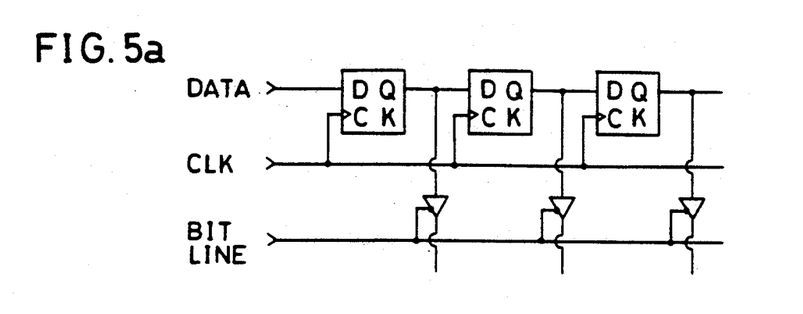
FIG. 5a is a circuit diagram of a shift register used as a bit line driver of the prior art programmable integrated circuit.
Figure 5B:
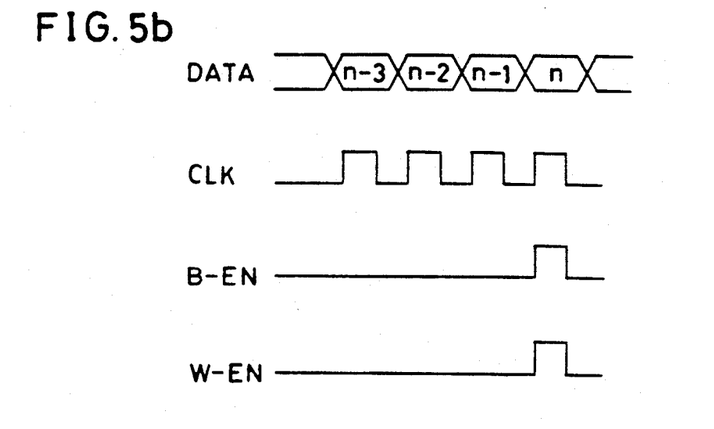
Figure 5C:
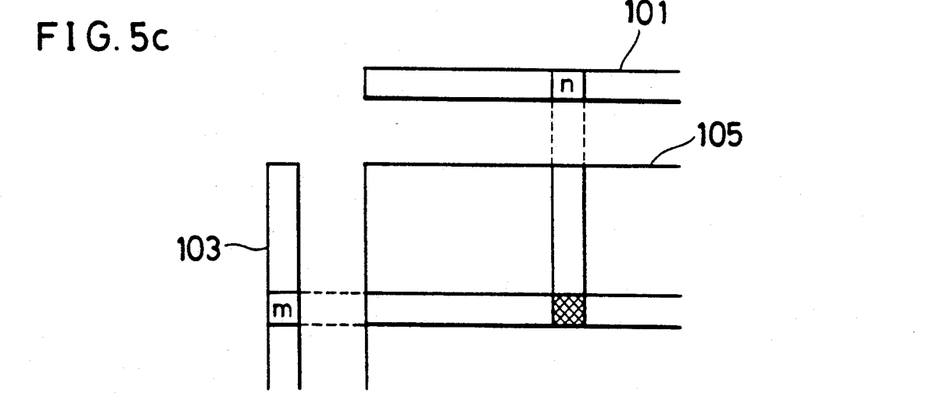
FIG. 5c is a conceptual diagram illustrating the process of writing data on the prior art programmable integrated circuit with a bit line driver and a word line driver.

Accordingly, in this case, the same operation as the one-bit shift type shift register shown in FIG. 5a is performed.

When a test program is written, the test signal line becomes a high level "H", the selector 15 (for example 15a) connected to the test signal line selects a signal to be inputted into the first terminal 19 (for example 19a) of the selector 15, namely a data signal, and supplies the data signal to the D input terminal of the D type flip-flop 13 (for example 13b).

In an example of the shift register shown in FIG. 1, wiring is made on the assumption that 8-bit parallel data is inputted in parallel upon test programming, and eight data lines are connected to the D type flip flops 13a to 13h. However, the first data line is directly connected to the D type flip-flop 13a, while the second to eighth data lines are connected selectively to the D type flip-flops 13b to 13h through seven selectors 15a to 15g, respectively. The Q output terminal of D type flip-flops 13a to 13h (for example 13a) is connected to the D input terminal of the ninth D type flip-flop (for example 13i) which is separated from the first flip-flop by seven flip-flops through the selector 15 (for example 15h). For example, the Q output terminal of the D type flip-flop 13a is connected to the D input terminal of the D type flip flop 13i which is seven flip-flops apart from the former flip-flop 13a through the selector 15h. Other D type flip-flops 13 are connected in the same way. Because of this configuration, when a test program is written, data of the Q output terminals of eight D type flip-flops 13a to 13h are each supplied simultaneously to D type flip-flops which are each separated from the former flip-flops by seven flip-flops in response to one clock from the clock signal line.

Figure 2A:
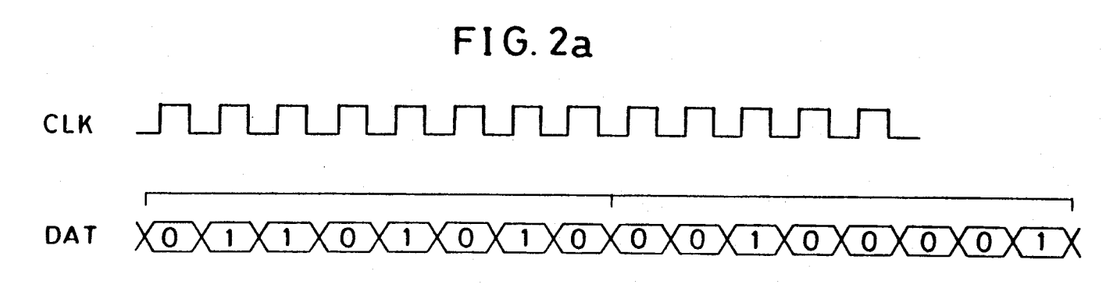
FIG. 2a and FIG. 2b are timing charts for writing an ordinary program and a test program in a programmable integrated circuit of the present invention, respectively.
Figure 2B:
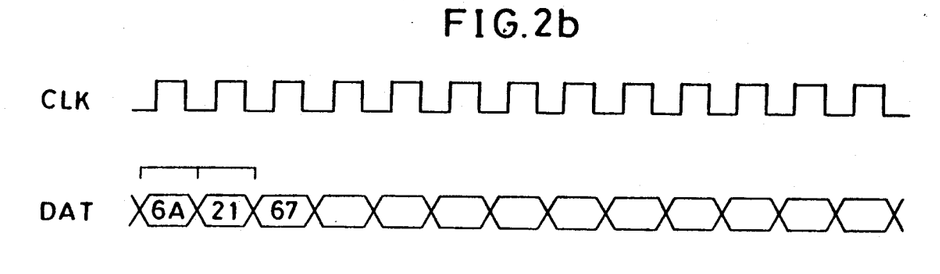

Timing charts for writing an ordinary program and a test program will be explained with reference to FIG. 2a and FIG. 2b. In FIG. 2a, there will be shown a clock signal CLK and a data write signal DAT for writing an ordinary program. The data write signal DAT is written on the PLD in one-bit series. For example, in case of circuit wiring as described in the foregoing, 8-bit data is written on the PLD in response to eight clocks. In FIG. 2b, there will be shown the clock signal CLK and the data write signal DAT for writing a test program. A plurality of bits of the data write signal DAT are written on the PLD in parallel. For example, in the circuit wiring as described in the foregoing, 8-bit data are written simultaneously on the PLD in response to one clock.

In the aforementioned circuit configuration according to the present invention, the bit width of data input can be changed to a desired or optimum width on the basis of a control signal from the test signal line. For example, the bit width can be changed from one-bit serial to 8-bit parallel, whereby the time required for test programming wherein several hundreds of test patterns are written, executed and erased can be reduced. The bit width can be easily changed not only to 8-bit parallel but also to 16-bit parallel, 32-bit parallel, 64-bit parallel or 4-bit parallel through the modification of wiring. Moreover, if a tri-state selector is used as the selector 15 for example, bit width for data input can be selected from one-bit serial, 8-bit parallel and 16-bit parallel or from 1-bit serial, 4-bit parallel and 8-bit parallel. For example, when an 8-bit parallel bit width is selected, transfer speed for data input can be approximately ⅛ that of one-bit serial, and when a 16-bit parallel bit width is selected, transfer speed for data input can be approximately 1/16. Through the use of a multi-input selectable selector, any desired bit width, smaller or larger than the aforementioned bit widths, can be selected. However, this is attended with an increase in circuit area due to complex wiring. A programmable integrated circuit has 1/5 the gate density of an ordinary LSI, and there is a design requirement that an increase in circuit area should be minimized. Therefore, it is appropriate to mount a shift register circuit which can select one from three different bit widths.

Figure 6:
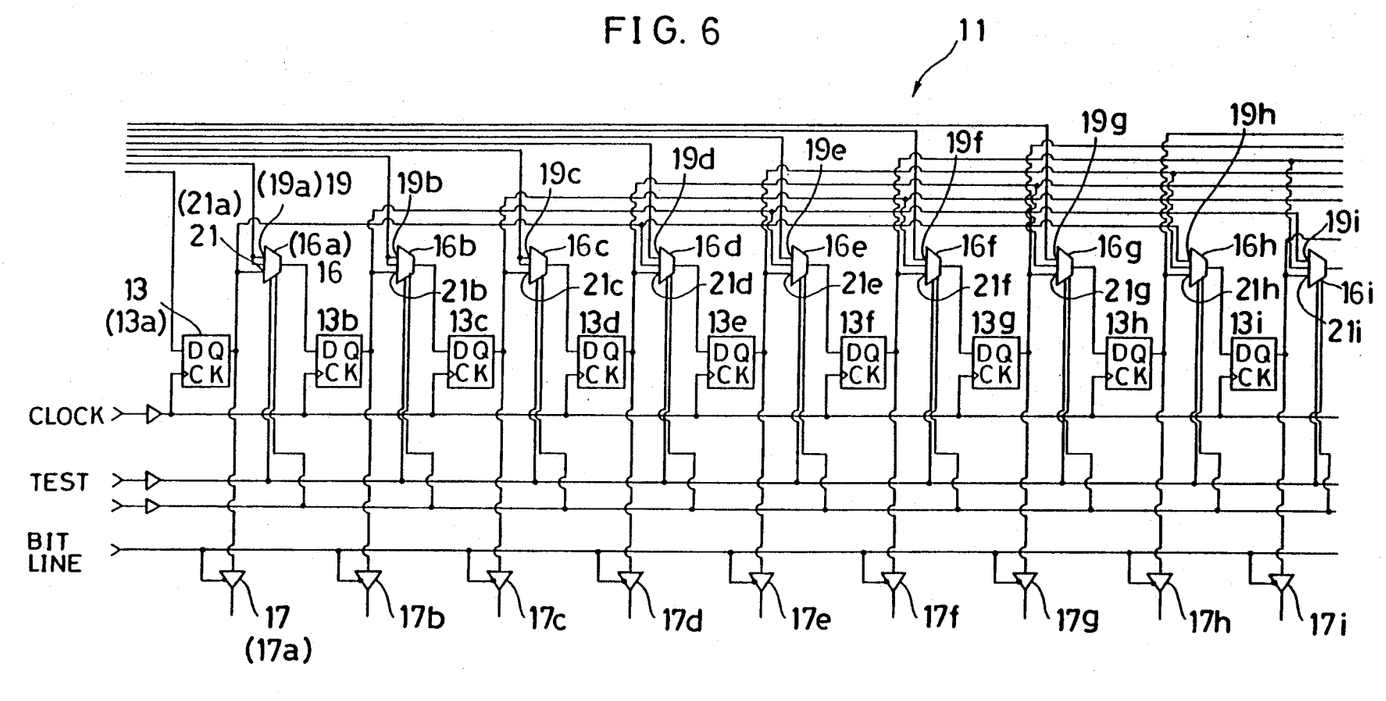
FIG. 6 is a circuit diagram of another embodiment of a shift register used as a bit line driver of a programmable integrated circuit according to the present invention.
Figure 7:
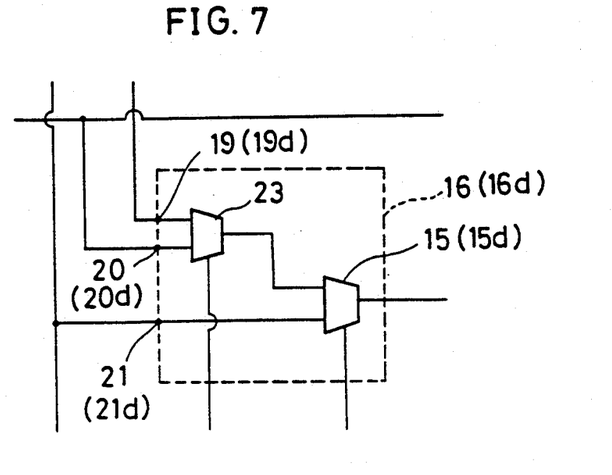
FIG. 7 is a circuit diagram of one embodiment of a tri-state selector according to the present invention.
Figure 8:
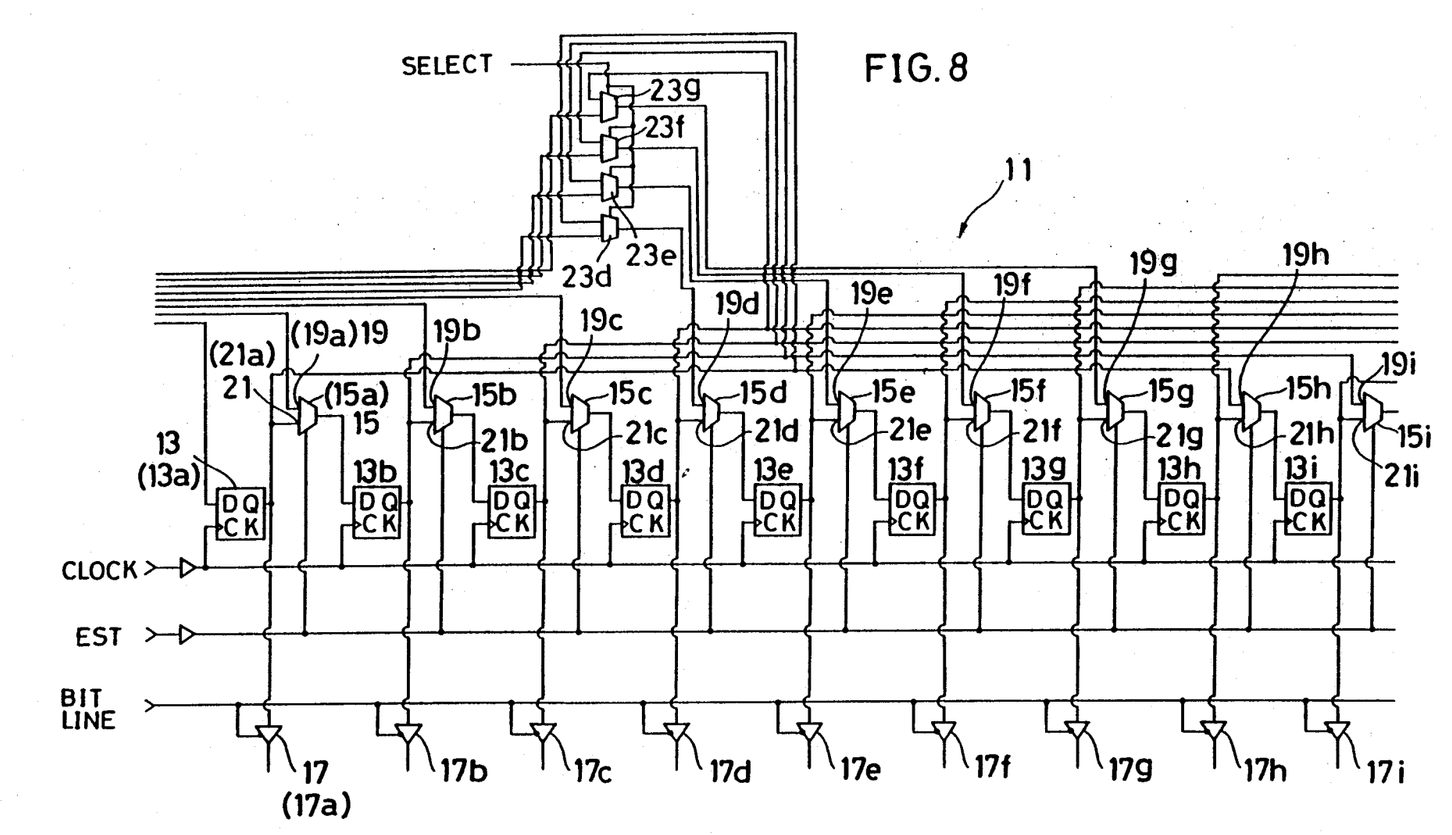
FIG. 8 is a circuit diagram of still another embodiment of a shift register used as a bit line driver of a programmable integrated circuit according to the present invention.

The selectors 16a to 16i comprise tri-state selectors, as shown in FIG. 6, and are used as selection means for changing the bit width. The selectors 16a to 16i are used in place of the bi-state selectors 15a to 15i, which are illustrated in FIG. 1. The selectors 16a–15i select the bit width, between 4 bits and 8 bits, according to a control signal from the bit width selection signal line (SELECT). FIG. 7 shows an embodiment of the circuit configuration of one (16d) of the tri-state selectors 16. The tri-state selector 16d has three input terminals: a first terminal 19, a second terminal 21 and a third terminal 20. The tri-state selector 16 shown in FIG. 7 comprises a bi-state selector 23 provided on the first terminal side of the bi-state selector 15 shown in FIG. 1. It is understood that selectors 16 illustrated in FIG. 6 do not have to be tri-state selectors, and may be bi-state selectors 15 as shown in FIG. 1. When the bi-state selectors 15 are used in place of the tri-state selectors 16 they may be equivalent circuits in construction as shown in FIG. 8. In this instance, bi-state selectors 23 (23d to 23g) forming the tri-state selectors 16 having the circuit configuration shown in FIG. 7 are used as a 4-bit set.

Figure 9A:
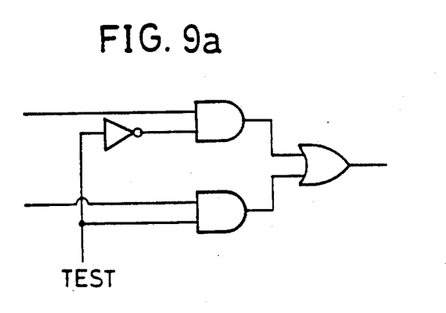
FIGS. 9(a) and 9(d) are circuit diagrams of further embodiments of tri-state selectors using normal gates and tri-state gates, respectively.
Figure 9B:
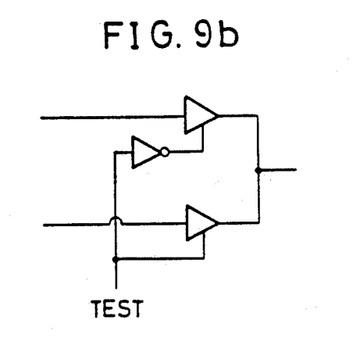
Figure 9C:
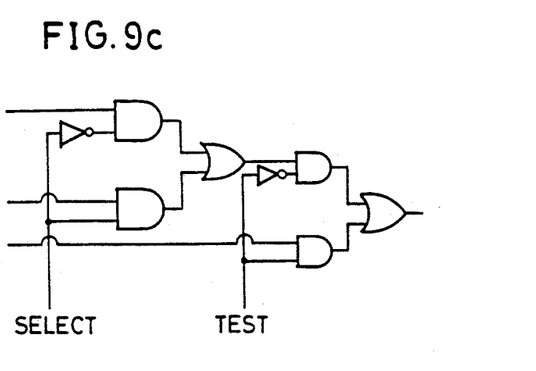
Figure 9D:
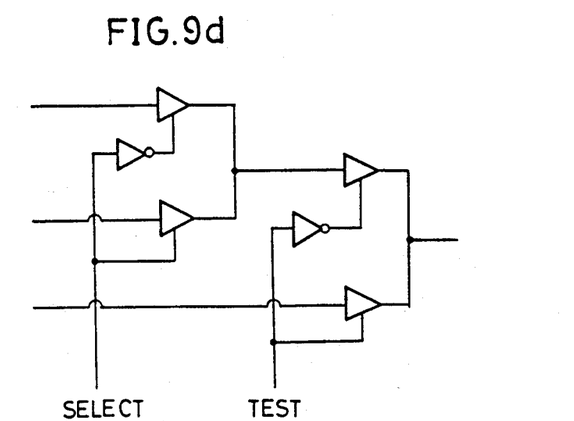

A circuit using a normal gate as shown in FIG. 9(a) or a circuit using a tri-state gate as shown in FIG. 9(b) may be used as the bi-state selectors 15 and 23. Similarly, the tri-state selectors 16 shown in FIG. 7 can have the circuit configuration as shown in FIG. 9(c) and FIG. 9(d).

According to the present invention, not only SRAMs but also other electrically writable and readable memory cells such as a PROM, EPROM and EEPROM, and gate arrays capable of program wiring can be used as a memory cell.

While the present invention has been described above on the basis of the particular illustrative embodiments shown in the attached drawings, it should be understood that the invention is by no means limited to those particular embodiments and that various modifications and improvements can be made without departing from the scope and spirit of the present invention.

As apparent from the detailed explanation in the foregoing, a programmable integrated circuit according to the present invention can change the input system of serial/parallel input-parallel output means for program data from serial to parallel or vice versa with selection means in response to a control signal from control signal input means. Therefore, a program can be written at a relatively low speed through the parallel output of serial input, and a program can be written at a relatively high speed by inputting data in parallel and outputting the input data in parallel. Moreover, the bit width of the aforementioned serial/parallel input-parallel output means can be changed in response to a control signal from control signal input means by the aforementioned selection means, whereby bit width for data input, shift and the like can be optimized according to the quantity of programs to be written with the result of improved freedom of users and the reduced time required for writing a large quantity of programs.

What is claimed is:

1. A programmable integrated circuit comprising:
a programmable logic device comprising programmable logic elements disposed in an array on which programming data can be written;
write means for writing said programming data on said programmable logic device, comprising:
serial input means for inputting one-bit serial data,
parallel input means for inputting at least one multiple-bit parallel data, and
means for selecting one of said serial input means or said parallel input means; and
means for inputting a control signal into the selection means for selecting one of said serial input means or said parallel input means;
wherein said selection means selects one of said serial input means or said parallel input means in response to the control signal, and
wherein said programming data write means comprises:
a first shift register for outputting temporarily written data in parallel to a bit line of said programmable logic device, and
a second shift register for outputting the serially input one-bit serial data in parallel to a word line.

2. The programmable integrated circuit of claim 1, wherein said selection means changes the bit width of the input data in response to the control signal from said control signal input means.

3. The programmable integrated circuit of claim 2, wherein said selection means changes the bit width of the input data between one bit and at least one of 4 bits, 8 bits, 16 bits, 32 bits and 64 bits.

4. The programmable integrated circuit of claim 1, wherein said selection means is a bi-state selector for selecting one of said serial input means or said parallel input means.

5. A programmable integrated circuit comprising:
a programmable logic device comprising programmable logic elements disposed in an array on which programming data can be written;
write means for writing said programming data on said programmable logic device, comprising:
serial input means for inputting one-bit serial data,
parallel input means for inputting at least one multiple-bit parallel data, and
means for selecting one of said serial input means or said parallel input means; and
means for inputting a control signal into the selection means for selecting one of said serial input means or said parallel input means;
wherein said selection means selects one of said serial input means or said parallel input means in response to the control signal and comprises a tri-state selector for selecting one of said serial input means, said parallel input means having a first parallel data bit-width and said parallel input means having a second parallel data bit-width.

6. A programmable integrated circuit having programmable logic elements to which programming data can be written, comprising:
programming data write means for writing the programming data to the programmable integrated circuit, comprising
output means for outputting in parallel one of serial input data and parallel input data and capable of changing an input bit width of the input data,
a first shift register for outputting temporarily written data in parallel to a bit line of said programmable logic device, and
a second shift register for outputting the serially input one-bit serial data in parallel to a word line; and
control signal input means for inputting a control signal to said output means; wherein
one of the serial input data and the parallel input data is selected for said output means in response to the control signal from said control signal input means, and
the input bit width of said output means is changed in response to said control signal.

7. A programmable integrated circuit, comprising:
programming data write means for writing programming data to the programmable integrated circuit,
wherein said programming data write means comprises a first-shift register for outputting serially input one-bit data in parallel to a word line and a second shift register for parallel output of data to a bit line, having a selector for selecting one of serial input data and parallel input data and for changing the bit width of data,
the programmable integrated circuit further comprises control signal input means for inputting a control signal into said selector, connected to a control input terminal of the selector of said second shift register, and
said selector of said second shift register selects one of the serial input data and the parallel input data to change the bit width of the input data in response to the control signal from said control signal input means.

* * * * *